United States Patent [19]

Pageaud et al.

[11] Patent Number: 5,196,651
[45] Date of Patent: Mar. 23, 1993

[54] ENCAPSULATION PACKAGE FOR ELECTRONIC COMPONENT

[75] Inventors: Michel Pageaud, Seurre; Michel Dautriche, Chamblanc, both of France

[73] Assignee: Compagnie Europeenne de Composants Electroniques LCC, Courbevoie, France

[21] Appl. No.: 620,001

[22] Filed: Nov. 30, 1990

[30] Foreign Application Priority Data

Dec. 8, 1989 [FR] France .................................. 89 16267

[51] Int. Cl.⁵ .............................................. H05K 5/00
[52] U.S. Cl. ...................................... 174/52.1; 174/50; 174/52.2
[58] Field of Search .................... 174/52.2, 50, 138 G, 174/52.1; 29/623.4, 868, 869; 264/272.11, 272.18; 336/96; 361/272

[56] References Cited

U.S. PATENT DOCUMENTS

| | | | |
|---|---|---|---|
| 3,046,452 | 7/1962 | Gellert | 336/96 |
| 3,403,366 | 9/1968 | Klatte et al. | 336/92 |
| 3,484,536 | 12/1969 | Jaeschke et al. | |
| 3,806,766 | 4/1974 | Fanning | 174/52.2 |
| 3,838,316 | 9/1974 | Brown et al. | |

FOREIGN PATENT DOCUMENTS 0324439 7/1989 European Pat. Off. .
3130837 2/1983 Fed. Rep. of Germany .

*Primary Examiner*—Leo P. Picard
*Assistant Examiner*—Bot Ledinh
*Attorney, Agent, or Firm*—Oblon, Spivak, McClelland, Maier & Neustadt

[57] ABSTRACT

A package for the encapsulation of an electronic component (50) includes a bottom (40), lateral faces (41) positioned around a main axis of the package and an open face (42) opposite the bottom (40). Each lateral face (41) includes guides (48) for guiding connection wires (45) of the component (50). These guides (48) are distributed evenly around the main axis of the package. The sides of the bottom (40) are equal.

11 Claims, 3 Drawing Sheets

SECTION 2.-2.

SECTION 5.-5.

ENCAPSULATION PACKAGE FOR ELECTRONIC COMPONENT

BACKGROUND OF THE INVENTION

1. Field of the Invention

The present invention concerns a package for the encapsulation of electronic components and, notably, capacitors.

2. Description of the Prior Art

The capacitors made according to a known method, for example by the successive stacking of foils of metallized films, require an external protection in order to improve their resistance to shocks and give them a better external appearance.

Generally, the packaging of capacitor type components consists in inserting the component, provided with two connection wires, into a package having an open face. Before or after the insertion of the component, the package is filled with a solidifiable liquid resin. The connection wires come out of the package upwards. The resin fills the unoccupied space between the package and the component. In solidifying, it holds the component solidly in the package.

The packages used may have a rectangular parallelepiped shape and a rectangular bottom, two small lateral faces, two large lateral faces and only one face opposite the open bottom.

Rectangular parallelepiped shaped components are encapsulated in this type of package. These components include two connection wires fixed into the central part of the small lateral faces.

The dimensions of the package are adjusted to those of the component with a view to obtaining reduced bulkiness.

The package also has means for guiding the connection wires of the component. These guiding means are located within the package on its lateral faces. Their shape enables the component to be inserted by a substantially vertical motion directed from the top downwards if the package is laid down on its bottom. When the connection wires are located on the small lateral faces of the component, in their central part, the guiding means are preferably located in the central part of the small lateral faces of the package. There are as many guiding means as there are connection wires.

To encapsulate components such as these automatically, at a high working rate, the connection wires of the components may be fixed to a vertical conveyor belt, the component being placed at the bottom of the belt. A package laid on its bottom is presented beneath each component, its open face pointed upwards. To insert the component into the package by a substantially vertical movement from the top downwards, the component must be aligned with the package. The lateral faces of the package must be parallel to the lateral faces of the component. But this is not enough.

Each connection wire must also be aligned with a guiding means. The lateral faces of the package bearing the guiding means must be parallel to the lateral faces of the component bearing the connection wires, if the component and the package have the above-described structures.

For this purpose, a vibratory bowl feeder is used. It distributes the packages and orients them all so that the guiding means are aligned with the connection wires. This orientation is done by the identifying of the small lateral faces or of the large lateral faces.

The need to optimize the capacitive volume of the stacked capacitors has led to making capacitors with square-shaped foils of metallized film.

As there is a continuing search for space on the printed circuits on which capacitors are mounted, the idea of encapsulating them in square-bottomed packages has been put forward. These square-bottomed packages are designed like conventional rectangular-bottomed packages, with as many means for guiding the connection wires as there are connection wires of the component. Capacitors and other components can be encapsulated in these square-bottomed packages.

As the package has a square bottom, its lateral faces are equal. The vibratory bowl feeder cannot detect the position of the guiding means, and cannot distribute the packages in a suitably oriented state.

These packages cannot be inserted into a standard automated encapsulation chain working at a fast rate.

SUMMARY OF THE INVENTION

The present invention seeks to overcome these drawbacks. The aim of the invention is to propose a package having equal lateral faces and all having guiding means arranged so as to avoid the need for orienting the package with respect to the component.

The present invention proposes a package for the encapsulation of an electronic component having a bottom and lateral faces bearing means for guiding connection wires of the component, arranged around a main axis of the package, wherein the bottom has equal sides and wherein the lateral faces all have guiding means, the guiding means being evenly distributed around the main axis of the package.

According to another characteristic, each lateral face includes at least one cleaning stand. The cleaning stands are evenly distributed around the main axis of the package.

The guiding means are placed within the package.

The guiding means may be placed in the central part of the lateral faces or at edges between two successive lateral faces. The guiding means may be formed by a groove.

The cleaning stands form projections which extend the lateral faces beyond a open face of the package opposite its bottom.

In a preferred embodiment, the package is parallelepiped-shaped, with a square-shaped bottom.

The package is made of a thermoplastic material by molding.

BRIEF DESCRIPTION OF THE DRAWINGS

The invention will be understood more clearly and other advantages will appear from the following detailed description, made with reference to the appended drawings, of which.

DETAILED DESCRIPTION OF THE INVENTION

Figure 1:
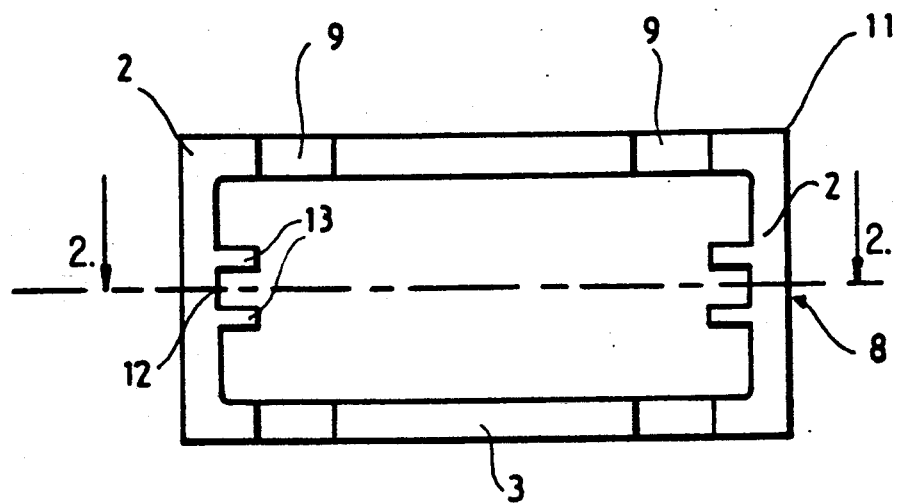
FIG. 1 shows a top view of a standard package laid on its bottom.
Figure 2:
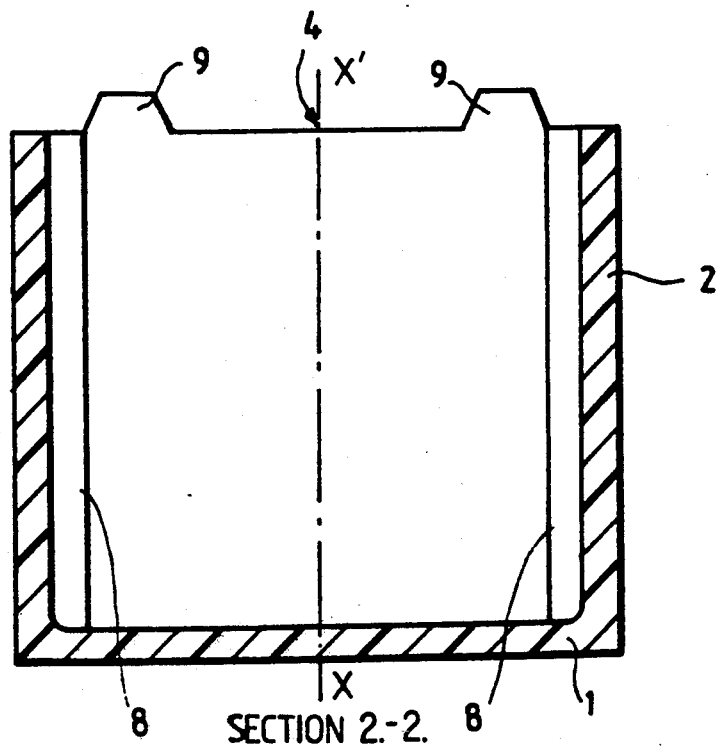
FIG. 2 shows a sectional view along the axis 2—2 of FIG. 1.
Figure 3:
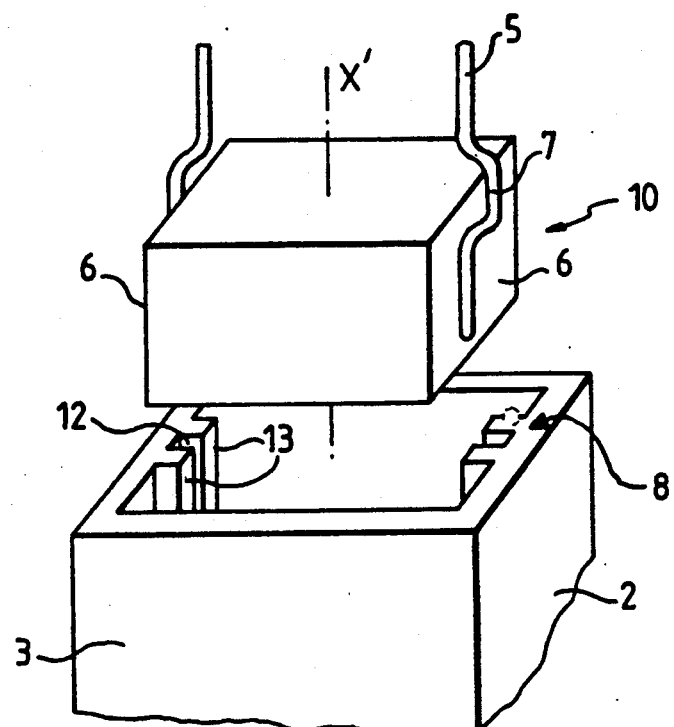
FIG. 3 shows a partial view of a standard package receiving a capacitor.

The standard package shown in FIGS. 1 to 3 has the shape of a rectangular parallelepiped. It has a bottom 1, four lateral faces 2, 3. The last face 4 of the parallelepiped is open and is pointed upwards when the package is laid on its bottom 1. The faces 2 are small faces and the faces 3 are large faces. The lateral faces are positioned around a main axis XX' of the package which is transversal to the bottom 1.

This package is designed to protect an electronic component 10 such as a capacitor constituted by a stack of metallized films, for example. The component 10 has the shape of a rectangular parallelepiped. It bears two connection wires 5 each fixed by one end, on two opposite faces. Herein, these faces are the small opposite faces 6. The other end of each of the wires is intended for connection to an electronic circuit. These two connection wires 5 are substantially parallel. The figure shows, on each wire 5, a part 7 that is substantially projecting from the component 10. This projecting part 7 is close to the end of the wire which is fixedly joined to the component 10. When the component 10 is inserted into the package, the projecting parts 7 are in contact with the interior of the package.

It is seen to it that the dimensions of the package are adjusted to those of the component provided with its connection wires 5, to reduce the bulkiness.

The package include means 8 for guiding the connection wires of the component 10. There are as many of them as there are connection wires 5. These guiding means 8 are placed within the package on its lateral faces 2, 3. The shape of the guiding means 8 enables the insertion of the component 10 into the package by a moment directed along the main axis XX' of the package.

In FIGS. 1 and 2, the guiding means 8 are grooves 12, with substantially parallel sides, positioned substantially along the main axis XX', from the bottom 1 towards the open face 4. They are shown in the central part of the small lateral faces 2 of the package. Each connection wire 5 gets embedded in a groove 12 and the projecting part 7 is well in contact with the lateral face 2. In FIGS. 1 and 3, it is seen that each groove 12 is limited by two ridges 13 placed within the package at the surface of each lateral face 2. It is possible to envisage an example where the grooves 12 are hollowed out within the lateral faces 2.

The package is filled, before or after the insertion of the component 10, with a solidifiable liquid resin. This resin fills all the unoccupied space between the package and the component 10. Once solidified, the resin holds the component permanently and solidly in the package.

The package also has cleaning stands 9. The cleaning stands form projections which extend the large side faces 3 of the package beyond the open face 4. Two cleaning stands 9 have been shown for each large lateral face 3.

In FIG. 3, the cleaning stands 9 have not been shown for clarity's sake.

When the component is mounted on a printed circuit, it is the cleaning stands 9 that lie on the circuit. These cleaning stands 9 raise the component above the circuit, so as to permit the flow of the solder bath and the washing liquid that are conventionally used during the mounting of components on a printed circuit.

The cleaning stands 9 are far enough from the edges 11, between two successive lateral faces 2, 3 of the package, to prevent the resin from rising, by capillary action, along the cleaning stands 9. Accumulations of solidified resin on the cleaning stands 9 would prevent the accurate mounting of the package on the printed circuit.

Packages of this type are made out of a thermoplastic material, by injection molding for example. The guiding means 8 and the cleaning stands 9 are molded at the same time.

We shall now describe an encapsulation operation.

The components 10 are generally held by their connection wires 5 on a vertical belt, the components 10 being positioned towards the bottom of the belt. A package positioned on its bottom 1 is presented beneath each component 10, and the package and the component 10 are aligned so that the lateral faces of the package are parallel with the lateral faces of the component. But this is not enough. The package should also be oriented in relation to the component so that the guiding means 8 are aligned with the connection wires 5. To this end, the large lateral faces 3 and the small lateral faces 2 of the package should be respectively parallel to the large lateral faces and the small lateral faces of the component 10.

This orientation can be got by using a vibratory bowl feeder for example. Packages are placed in the bowl and come out of it sliding into an appropriate device, along their small lateral face for example.

Figure 4:
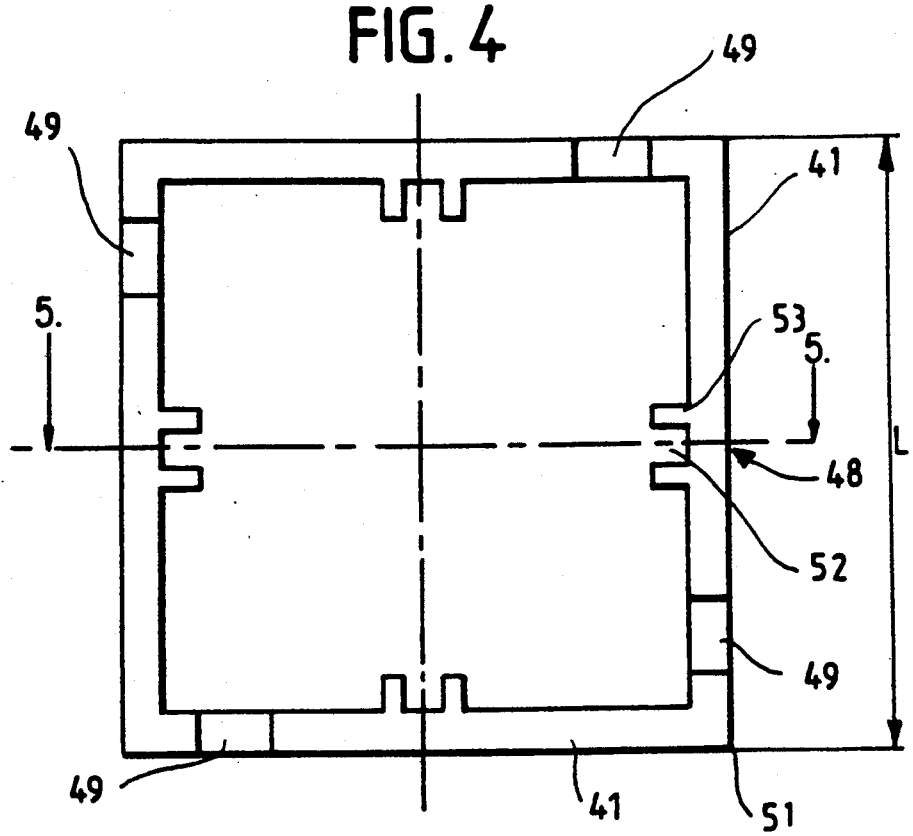
FIG. 4 shows a top view of a package according to the invention, laid on its bottom.
Figure 5:
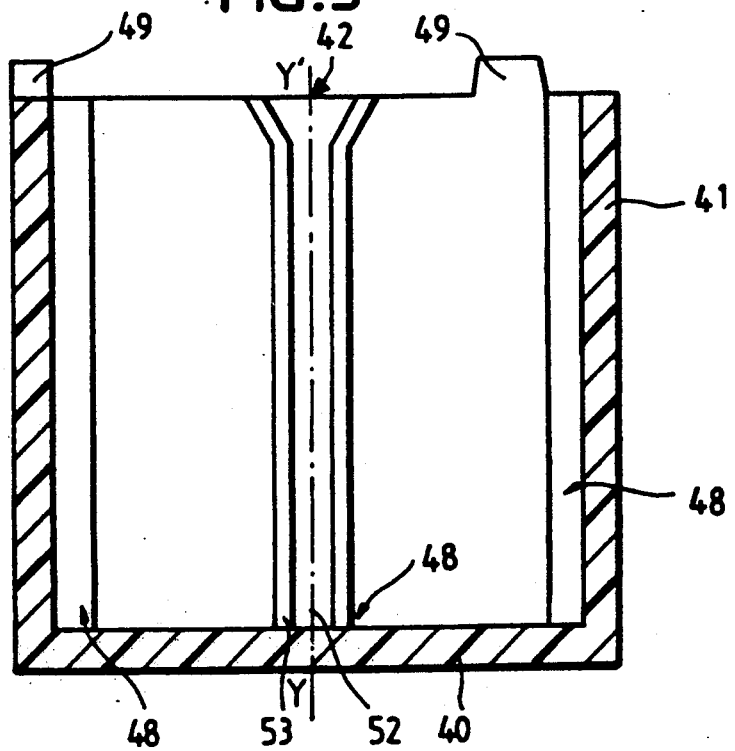
FIG. 5 shows a sectional view along the axis 5—5 of FIG. 4.

FIGS. 4, 5 represent respectively a top view and a sectional view of an embodiment of a package according to the invention.

The package has a bottom 40, lateral faces 41 positioned around a main axis YY' of the package, and an open face 42 opposite the bottom.

The package is shown laid on its bottom 40 in FIG. 5. The main differences with the standard package lie in the level of the lateral faces 41 and of the bottom 40. The bottom 40 of the package has equal sides. The lateral faces 41 all have the same width L. In FIG. 4, it can be seen that the package is parallelepiped shaped, with a square bottom 40.

Figure 6:
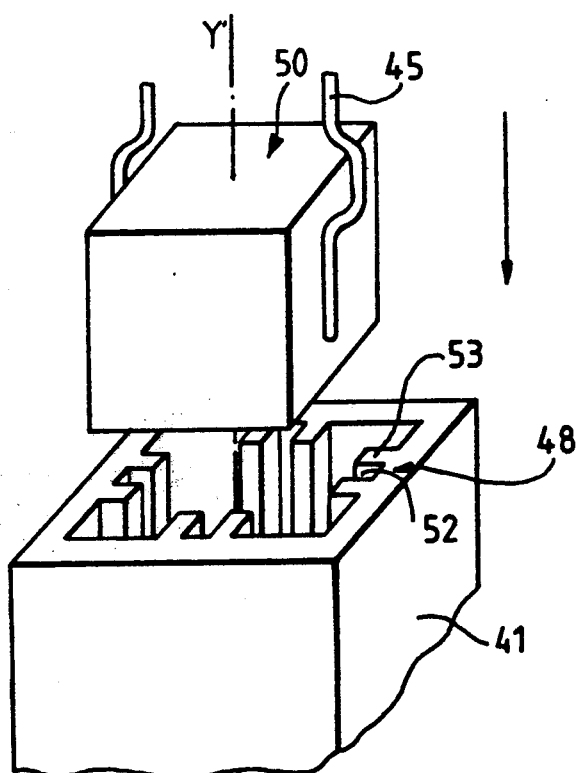
FIG. 6 shows a partial view of a package, according to the invention, receiving a capacitor; in these figures, the same references represent the same elements.

We shall now refer to FIG. 6. This package is designed to encapsulate a component 50 comparable to the one shown in FIG. 3 but with a square cross-section.

The dimensions of the package are adjusted to those of the component 50. This component 50 is provided, conventionally, with connection wires 45 fixed to two opposite lateral faces in their central parts. These connection wires 45 are comparable to those described above.

All the lateral faces 41 of the package include guiding means 48 of the connection wires 45. The guiding means 48 are placed inside the package. They are distributed evenly around the axis YY'.

As many guiding means 48 have been shown as there are lateral faces 41. There could be more of them. They are shown in the central part of each lateral face 41 but this is only an exemplary embodiment.

The guiding means 48 have a shape that is suited to enabling the insertion of the component 50 by a motion of the package and/or the component 50 along the main axis YY'. If the package is laid on its bottom 40, it will be possible to shift the component 50 substantially vertically from the top downwards.

Guiding means 48 have been made in the form of grooves 52 with substantially parallel sides. They extend along the main axis YY', from the bottom 40 towards the open face 42. Each groove 52 is positioned in the central part of a lateral face 41.

It is possible to conceive of a method of encapsulating components of another type having, for example, connection wires placed on two opposite edges, wherein the grooves are placed in the corners of the package at the level of edges 51 between two lateral faces 41.

As in the standard package, the grooves 52 may be limited by two substantially parallel ridges 53. These ridges 53 are positioned on the surface of the lateral walls 41. In another configuration, the grooves 52 may be hollowed out in the lateral faces 41. At the level of the open face 42 of the package, the grooves 52 assume a funnel shape to make it easier to insert the connection wires 45 if the alignment of the package and of the component 50 is not perfectly accurate.

Each lateral face 41 now has at least one cleaning stand 49. The cleaning stands 49 are preferably distributed evenly around the main axis YY'. As in the standard packages, each cleaning stand 49 forms a projection which extends a lateral face 41 beyond the open face 42.

The cleaning stands 49 have the same dimension as those used in standard packages. They fulfill the same role.

Only one cleaning stand 49 per lateral face 41 has been shown.

In FIG. 6, the cleaning stands are not shown in order to improve the clarity of the figure.

The package is filled with solidifiable liquid resin before or after the insertion of the component 50. The cleaning stands 49 are at a sufficient distance from the edges 51 of the package to prevent the resin from rising up by capillary action along the legs 49, beyond the open face 42.

A package according to the invention can be made out of a thermoplastic material by injection molding. The guiding means 48 and the cleaning stands 49 could be molded at the same time.

We shall now describe an operation for encapsulating a component in a package according to the invention. This is only an example.

The components 50 are held on a vertical belt by their connection wires 45. The components 50 are positioned towards the bottom of the belt. A package laid on its bottom 40 is presented beneath each component 50, and the package and the component 50 are aligned so that the lateral faces 41 of the package are parallel with the lateral faces of the component 50.

Since the lateral faces 41 of the package have the same width L and since they include guiding means distributed evenly around the main axis YY', there is no longer any need to orient the package with respect to the component 50. The guiding means are all placed at the same places on the lateral faces 41. The connection wires 45 will be facing the guiding means 48.

The packages will then be placed in a vibratory bowl feeder and they will be distributed in the appropriate position in sliding, for example, along one of their lateral faces 41.

The present invention is not restricted to the square-bottomed parallelepiped packages. The bottom may be diamond-shaped. It may have even more or even less than four sides.

What is claimed is:

1. A package for the encapsulation of an electronic component, said package having a bottom and lateral faces, said lateral faces including guiding means for guiding connection wires of the component, said lateral faces arranged around a main axis of the package, wherein the bottom includes a periphery having equal sides therearound and wherein the lateral faces all have guiding means, the guiding means being distributed evenly around the main axis of the package.

2. A package according to claim 1, wherein each lateral face includes at least one cleaning stand.

3. A package according to claim 2, wherein the cleaning stands are evenly distributed around the main axis.

4. A package according to one of the claims 1 to 3, wherein the guiding means are placed within the package.

5. A package according to claim 1, wherein the guiding means are placed in the central part of each lateral face.

6. A package according to claim 1, wherein the guiding means are placed at edges between two successive lateral faces.

7. A package according to claim 1, wherein the guiding means have the shape of a groove, directed along the main axis of the package.

8. A package according to claim 1, wherein the package is parallelepiped-shaped, its bottom having a square or diamond shape.

9. A package according to claim 1, wherein it is made of a thermoplastic material, by molding.

10. A package for encapsulation of an electronic component, said package including a bottom and lateral faces, said lateral faces including guiding means for guiding connection wires of the component, wherein said bottom includes a periphery having sides of equal length, each of the lateral faces having guiding means thereon with said guiding means evenly distributed about a main axis of the package;
   each lateral face including at least one cleaning stand; and
   wherein the cleaning stands form projections which extend the lateral faces beyond an open face of the package opposite its bottom.

11. A package for encapsulation of an electronic component, said package including a bottom and lateral faces, said lateral faces including guiding means for guiding connection wires of the component, wherein said bottom includes a periphery having sides of equal length, each of the lateral faces having guiding means thereon with said guiding means evenly distributed about a main axis of the package;
   each lateral face including at least one cleaning stand; and
   wherein the cleaning stands are at a distance from edges between two successive lateral faces so that, when the package is filled with a liquid resin, said liquid resin is prevented from rising up by capillary action along the cleaning stands.

* * * * *